United States Patent
Manku et al.

(10) Patent No.: US 7,164,897 B2
(45) Date of Patent: Jan. 16, 2007

(54) METHOD AND APPARATUS FOR CONVERSION OF RADIO FREQUENCY (RF) SIGNALS USING APERIODIC MIXING SIGNALS

(75) Inventors: Tajinder Manku, Kitchener (CA); Yang Ling, Waterloo (CA); William Kung, Waterloo (CA)

(73) Assignee: Sirific Wireless Corporation, Waterloo (CA)

( * ) Notice: Subject to any disclaimer, the term of this patent is extended or adjusted under 35 U.S.C. 154(b) by 83 days.

(21) Appl. No.: 10/486,830

(22) PCT Filed: Aug. 28, 2002

(86) PCT No.: PCT/CA02/01316

§ 371 (c)(1),
(2), (4) Date: Aug. 2, 2004

(87) PCT Pub. No.: WO03/019800

PCT Pub. Date: Mar. 6, 2003

(65) Prior Publication Data

US 2004/0246047 A1 Dec. 9, 2004

(30) Foreign Application Priority Data

Aug. 28, 2001 (CA) ................................. 2356077

(51) Int. Cl.
*H04B 1/18* (2006.01)

(52) U.S. Cl. .................. 455/293; 455/208; 455/209; 455/309; 455/312

(58) Field of Classification Search ................ 455/208, 455/209, 293, 309, 321, 315, 326, 312, 323, 455/296, 255, 114.2
See application file for complete search history.

(56) References Cited

U.S. PATENT DOCUMENTS

| | | | | |
|---|---|---|---|---|
| 4,710,730 A | * | 12/1987 | Doyle, III | 331/116 FE |
| 4,736,390 A | * | 4/1988 | Ward et al. | 375/316 |
| 5,325,394 A | | 6/1994 | Bruckert | |
| 5,337,056 A | * | 8/1994 | Dax | 342/128 |
| 5,414,728 A | | 5/1995 | Zehavi | |
| 5,678,225 A | * | 10/1997 | Kobayashi | 455/330 |
| 5,862,173 A | | 1/1999 | Dent | |
| 5,933,056 A | * | 8/1999 | Rothenberg | 330/258 |
| 6,507,627 B1 | * | 1/2003 | Imura | 375/332 |
| 6,766,157 B1 | * | 7/2004 | Hunzeker et al. | 455/317 |
| 2002/0004372 A1 | * | 1/2002 | Gharpurey | 455/78 |
| 2003/0027534 A1 | * | 2/2003 | Swazey | 455/118 |
| 2004/0166799 A1 | * | 8/2004 | Kral | 455/3.02 |

FOREIGN PATENT DOCUMENTS

| | | |
|---|---|---|
| EP | 0632611 A2 | 1/1995 |
| WO | WO 0117120 A2 | 3/2001 |

* cited by examiner

*Primary Examiner*—Matthew Anderson
*Assistant Examiner*—Tuan Pham
(74) *Attorney, Agent, or Firm*—Shin Hung; Borden Ladner Gervais LLP (57) ABSTRACT

An inexpensive, high-performance, fully-integrable, multi-standard transceiver with a topology including: an active mixer, followed by a high pass filter, and a passive mixer. The input signal is modulated up, or demodulated down, using a pair of complementary, aperiodic mixing signals. The use of aperiodic mixing signals allows a fully-integrated transceiver to be built. Embodiments of the active mixer include those having electrically-adjustable performance and allowing multiple RF signal inputs. This allows the topology to be employed in multi-band, multi-frequency applications, while still providing high performance.

22 Claims, 8 Drawing Sheets

METHOD AND APPARATUS FOR CONVERSION OF RADIO FREQUENCY (RF) SIGNALS USING APERIODIC MIXING SIGNALS

The present invention relates generally to communications, and more specifically to a method and apparatus of modulating and demodulating RF (radio frequency) and baseband signals using periodic mixing signals. The preferred embodiment of the invention satisfies the need for an inexpensive, high-performance, fully-integrable, multi-standard transceiver.

BACKGROUND OF THE INVENTION

Many communication systems modulate electromagnetic signals from baseband to higher frequencies for transmission, and subsequently demodulate those high frequencies back to their original frequency band when they reach the receiver. The original (or baseband) signal may be, for example: data, voice or video. These baseband signals may be produced by transducers such as microphones or video cameras, be computer generated, or transferred from an electronic storage device. In general, the high frequencies provide longer range and higher capacity channels than baseband signals, and because high frequency (HF) radio frequency (RF) signals can effectively propagate through the air, they can be used for wireless transmissions as well as hard wired or fibre channels.

All of these signals are generally referred to as RF signals, which are electromagnetic signals; that is, waveforms with electrical and magnetic properties within the electromagnetic spectrum normally associated with radio wave propagation.

Wired communication systems which employ such modulation and demodulation techniques include computer communication systems such as local area networks (LANs), point-to-point communications, and wide area networks (WANs) such as the Internet. These networks generally communicate data signals over electrically conductive or optical fibre channels. Wireless communication systems which may employ modulation and demodulation include those for public broadcasting such as AM and FM radio, and UHF and VHF television. Private communication systems may include cellular telephone networks, personal paging devices, HF radio systems used by taxi services, microwave backbone networks, interconnected appliances under the Bluetooth standard, and satellite communications. Other wired and wireless systems which use RF modulation and demodulation would be known to those skilled in the art.

Most RF receivers use the "super-heterodyne" topology, which provides good performance in a limited scope of applications, such as in public-broadcast FM radio receivers. As will be explained, these limitations make its use in more sophisticated modern applications expensive and its performance poor.

Figure 1:
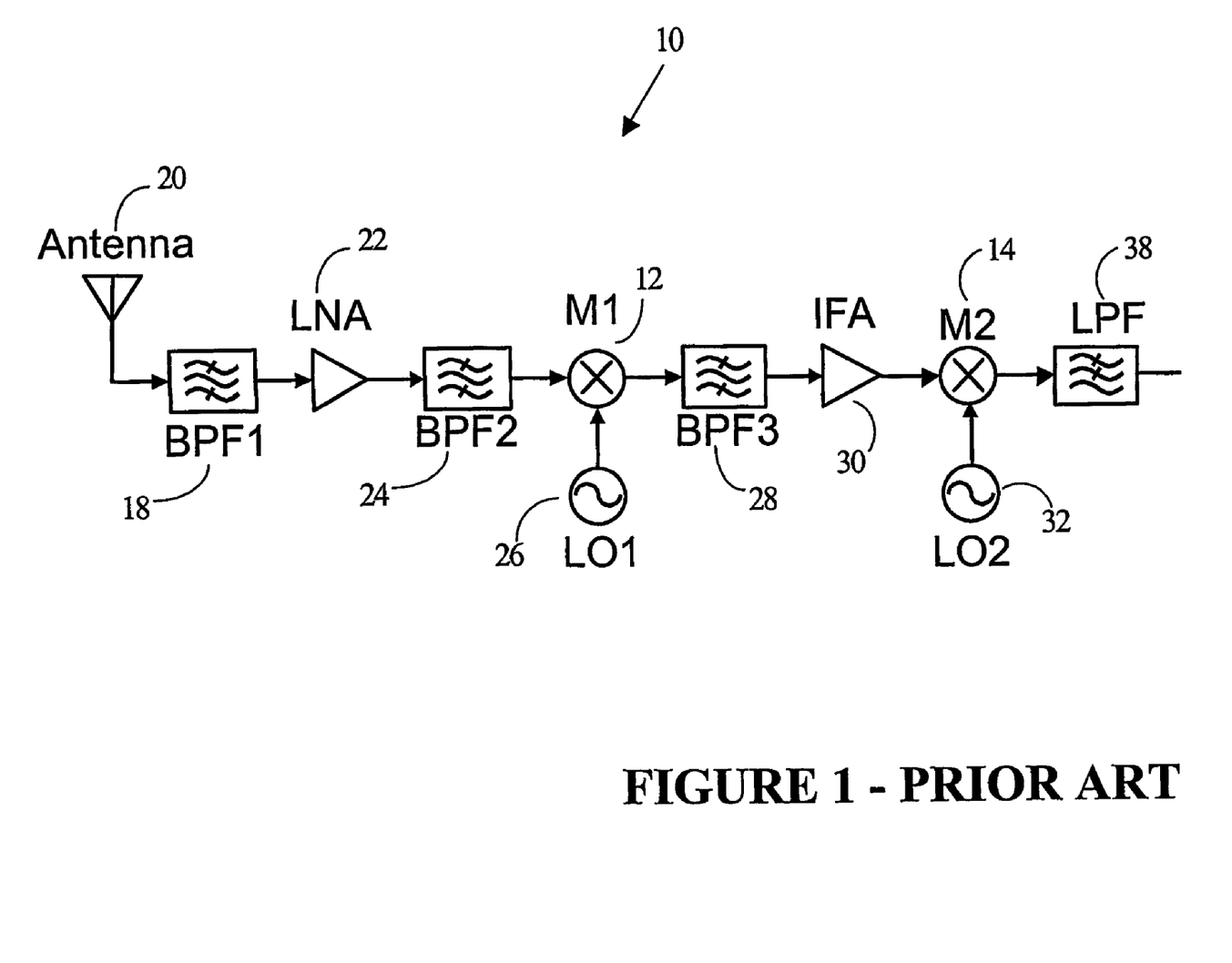
FIG. 1 presents a block diagram of a super-heterodyne system as known in the art.

The super-heterodyne receiver uses a two-step frequency translation method to convert an RF signal to a baseband signal. FIG. 1 presents a block diagram of a typical super-heterodyne receiver 10. The mixers labelled M1 12 and M2 14 are used to translate the RF signal to baseband or to some intermediate frequency (IF). The balance of the components amplify the signal being processed and filter noise from it.

The RF band pass filter (BPF1) 18 first filters the signal coming from the antenna 20 (note that this band pass filter 18 may also be a duplexer). A low noise amplifier 22 then amplifies the filtered antenna signal, increasing the strength of the RF signal and reducing the noise figure of the receiver 10. The signal is next filtered by another band pass filter (BPF2) 24 usually identified as an image rejection filter. The signal then enters mixer M1 12 which multiplies the signal from the image rejection filter 24 with a periodic signal generated by the local oscillator (LO1) 26. The mixer M1 12 receives the signal from the image rejection filter 24 and translates it to a lower frequency, known as the first intermediate frequency (IF1).

Generally, a mixer is a circuit or device that accepts as its input two different frequencies and presents at its output:
(a) a signal equal in frequency to the sum of the frequencies of the input signals;
(b) a signal equal in frequency to the difference between the frequencies of the input signals; and
(c) the original input frequencies.

The typical embodiment of a mixer is a digital switch which may have significantly more tones than stated above.

The IF1 signal is next filtered by a band pass filter (BPF3) 28 typically called the channel filter, which is centred around the IF1 frequency, thus filtering out the unwanted products of the first mixing processes; signals (a) and (c) above. This is necessary to prevent these signals from interfering with the desired signal when the second mixing process is performed.

The signal is then amplified by an intermediate frequency amplifier (IFA) 30, and is mixed with a second local oscillator signal using mixer M2 14 and local oscillator (LO2) 32. The second local oscillator LO2 32 generates a periodic signal which is typically tuned to the IF1 frequency. Thus, the signal coming from the output of M2 14 is now at baseband, that is, the frequency at which the signal was originally generated. Noise is now filtered from the desired signal using the low pass filter LPF 38, and the signal is passed on to some manner of presentation, processing or recording device. For example, in the case of a radio receiver, this might be an audio amplifier, while in the case of a computer modem this may be an analogue to digital convertor.

Note that the same process can be used to modulate or demodulate any electrical signal from one frequency to another.

The main problems with the super-heterodyne design are:
it requires expensive off-chip components, particularly band pass filters 18, 24, 28, and low pass filter 38;
the off-chip components require design trade-offs that increase power consumption and reduce system gain;
image rejection is limited by the off-chip components, not by the target integration technology;
isolation from digital noise can be a problem; and
it is not fully integratable.

The band pass and low pass filters 18, 24, 28 and 38 used in super-heterodyne systems must be high quality devices, so electronically tunable filters cannot be used. As well, the only way to use the super-heterodyne system in a multi-standard/multi-frequency application is to use a separate set of off-chip filters for each frequency band.

Direct-conversion transceivers attempt to perform up and down conversion in a single step, using one mixer and one local oscillator. In the case of down-conversion to baseband, this requires a local oscillator with a frequency equal to that of the input RF signal. If the LO signal of a direct conversion receiver leaks into the signal path, it will also be demodulated to baseband along with the input signal, causing interference. This LO leakage problem limits the utility of direct-conversion transceivers.

One of the current problems in the art is to develop effective transceivers (i.e. devices having both a receiver and a transmitter) that can adapt to the varying requirements caused either by changing reception conditions, or even changing standards during the use of the device. For cellular telephones and similar consumer items, it is desirable to have transceivers that can be fully integrated onto inexpensive, low power integrated circuits (ICs).

This continuing desire to implement low-cost, power efficient receivers and transmitters has led to intensive research into the use of highly integrated designs, an increasingly important aspect for portable systems, including cellular telephone handsets. This has proven especially challenging as the frequencies of interest in the wireless telecommunications industry (especially low-power cellular/micro-cellular voice/data personal communications systems) have risen above those used previously (approximately 900 MHz) into the spectrum above 1 GHz.

Attempts to provide flexible designs in Radio Frequency Integrated Circuits (RFICs)—also known as monolithic microwave integrated circuits (MMICs)—allowing for multiple standards and varying conditions of reception have met with limited success. These designs usually provide duplication of the functions affected by these considerations. One example is that presented in U.S. Pat. No. 6,185,418, titled "Adaptive digital radio communication system", which involves reconfiguring the system by reprogramming at least one programmable device such as a Programmable Logic Device (PLD) to perform the digital communications processing functions of the transmitter or the receiver of a radio communications system. Other implementations are related to the ability to distinguish between and cope with very different modulation schemes. One such example is given in U.S. Pat. No. 5,649,288, titled: "Dual-function double balanced mixer circuit".

Thus, there is a need for a method and apparatus for modulation and demodulation which addresses the problems above. It is desirable that this design be fully-integratable, inexpensive and high performance. As well, it is desirable that this design be easily applied to multi-standard/multi-frequency applications.

SUMMARY OF THE INVENTION

It is therefore an object of the invention to provide a novel method and system of modulation and demodulation which obviates or mitigates at least one of the disadvantages of the prior art.

The invention provides a circuit topology and methodology which may be applied to up or down conversion of electrical signals. This design employs a two-stage mixing process, the first mixing being performed with an active mixer, and the second using a passive mixer. Between these two mixers a high pass filter is placed.

The active mixer amplifies the incoming signal as well as mixing it. The high pass filter reduces second order distortion (1/f noise) generated by the active mixer, to an acceptable level before passing the signal to the passive mixer. The high pass filter also filters off low frequency common mode and differential signals from entering the passive mixer. These types of signals may arise from the DC offsets of the first mixer and second order distortion from the first mixer. Because the second mixer is a passive mixer, it does not introduce 1/f noise.

Complements to this topology include the following:
1. the use of switched elements within the active mixer to control its gain and noise figure. This improves the performance of the topology in multi-standard/multi-frequency applications as it can be optimised for more than one state;
2. the use of a high pass filter incorporating a voltage divider, which sets the common mode input levels to the second passive mixer, improving 'parameter repeatability'. This aspect is becoming increasingly important in high volume RF semiconductor production;
3. the high pass filter can be made up of a CMOS feedback circuit sensing the outputs of the active mixer; and
4. the use of aperiodic mixing signals (such as pseudo-random "virtual local oscillator" signals) rather than mono-tonal local oscillator signals used in the art. Such signals produce much less noise than previously used signals, and do not require multiple band-pass and other filters.

The result is an inexpensive, high-performance, multi-standard/multi-frequency transceiver which can be fully integrated.

One aspect of the invention is defined as a modulation or demodulation circuit comprising: an active mixer for receiving an input signal and mixing the input signal with a first aperiodic mixing signal, the active mixer having adjustable performance; a high pass filter electrically connected to the output of the active mixer, generating a filtered, mixed signal; and a passive mixer-connected to the output of the high pass filter, for receiving the filtered, mixed signal and a second aperiodic mixing signal, and mixing the filtered, mixed signal with the second aperiodic mixing signal.

Another aspect of the invention is defined as a method of up or down conversion comprising the steps of: active mixing an input signal with a first aperiodic mixing signal; high pass filtering the first mixed signal; and passive mixing the filter signal with a second aperiodic mixing signal.

BRIEF DESCRIPTION OF THE DRAWINGS

These and other features of the invention will become more apparent from the following description in which reference is made to the appended drawings in which.

DETAILED DESCRIPTION OF THE INVENTION

Figure 2:
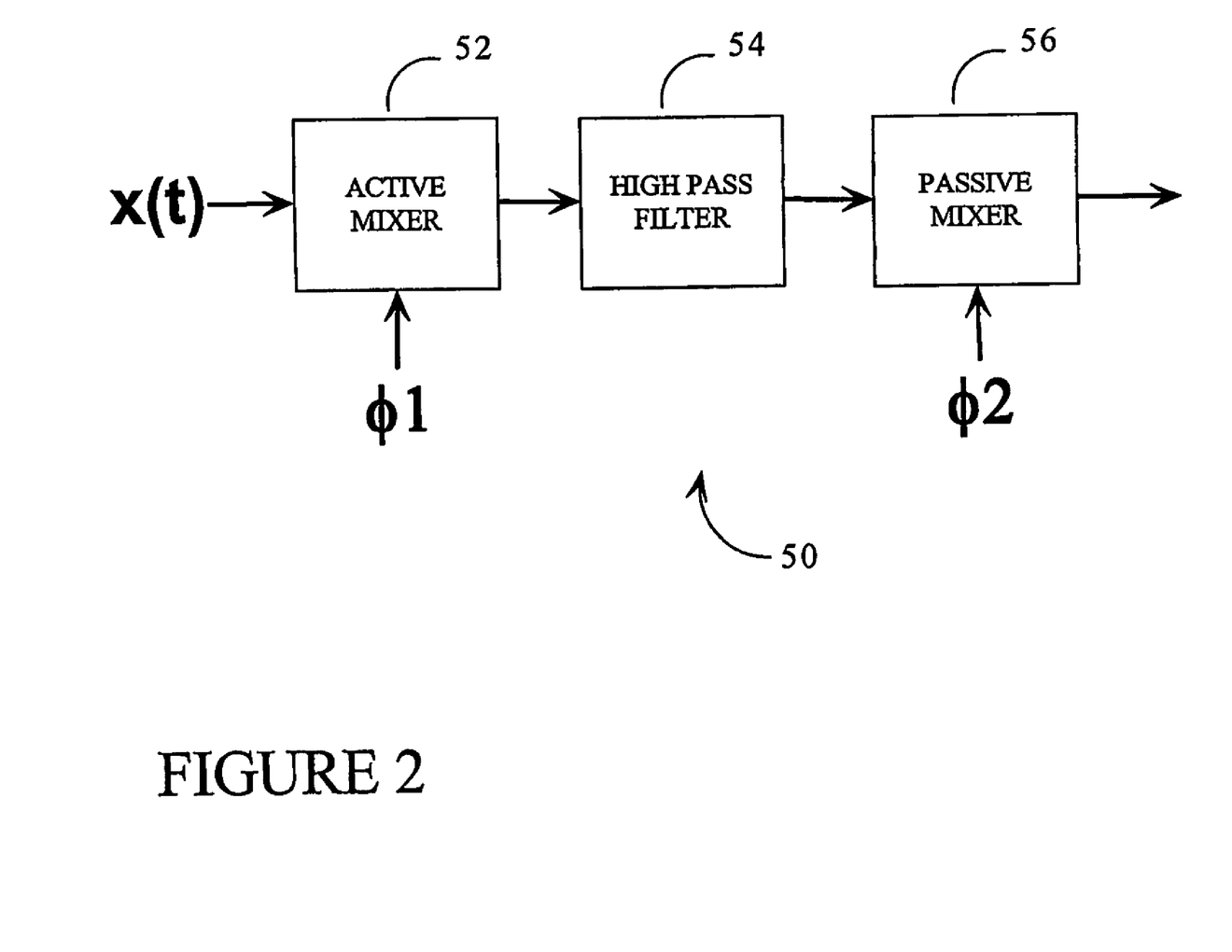
FIG. 2 presents a block diagram of a modulator/demodulator topology in a broad embodiment of the invention.

A circuit which addresses a number of the objects outlined above is presented as a block diagram in FIG. 2. This figure presents a modulator or demodulator topology 50 in which an input signal x(t) is mixed with two aperiodic oscillator signals (labelled $\phi_1$ and $\phi_2$) which effect the desired modulation or demodulation. While this block diagram may seem similar to known topologies, it has a number of features which are quite distinct from that of the prior art.

As a matter of overview, the input signal x(t) is mixed with the first aperiodic oscillator signal $\phi_1$ using an active mixer 52. The resulting signal then passes through a high pass filter (HPF) 54, which removes DC components generated by the active mixer 52. The filtered signal is then mixed with the second aperiodic oscillator signal $\phi_2$ by means of passive mixer 56.

Particular design parameters for the two mixers 52 and 56 would be clear to one skilled in the art, having the typical properties of an associated noise figure, linearity response, and conversion gain. The selection and design of these mixers would follow the standards known in the art. Though this figure implies that various elements are implemented in analogue form, they can also be implemented in digital form.

Typical modulation and demodulation circuits use local oscillator signals which do not vary in frequency over time (i.e. they are mono-tonal, or periodic). Recently, however, there has been a growing realization that local oscillator signals whose frequencies vary over time, may effect modulation and demodulation far more effectively. The preferred manner of such aperiodic local oscillator signals are described with respect to FIG. 7 hereinafter, but the teachings of the invention may also be used with aperiodic signals described by others, including the following:

1. the switching oscillator and inversion signals described in patent application serial no. PCT/US99/08659 filed by Ericsson Inc.;
2. the "mitigation signals" described in patent application serial no. PCT/US99/22157 filed by Motorola Inc.; and
3. the pseudo-random signals described in patent application serial no. PCT/US95/08019 filed by Honeywell Inc.

Figure 7:
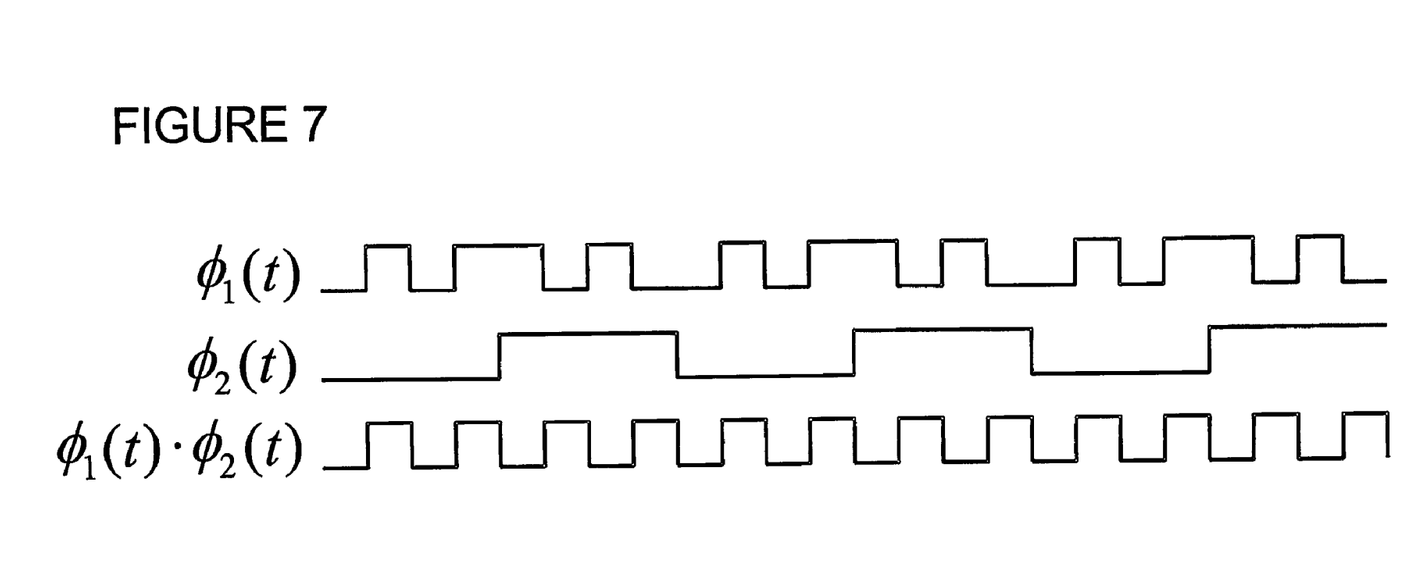
FIG. 7 presents a exemplary mixer input signals pairing, plotted in amplitude against time, in an embodiment of the invention.

Briefly, FIG. 7 describes pairings of mixing signals which together emulate local oscillator signals, but do not have significant power at the frequencies of the local oscillators being emulated. In this way, the frequency translation is still effected, but self-mixing and unwanted mixing products are avoided.

While the components in the topology of FIG. 2 are commonly used in communication applications, this particular combination of components provides a very useful synergy when used with the aperiodic oscillator signals. Also, it will become clear from the description which follows, that this topology is particularly useful when applied to multi-standard/multi-frequency devices.

Active mixers such as that used in FIG. 2 are distinct from passive mixers in a number of ways:

1. they provide conversion gain; thus, an active mixer can replace the combination of a low noise amplifier and a passive mixer;
2. active mixers provide better isolation between the input and output ports because of the impedance of the active components; and
3. active mixers allow a lower powered mixing signal to be used, reducing the noise that results when the mixing signal is generated.

In spite of these advantages, the application of active mixers in modulation and demodulation topologies is still problematic. Because active mixers are non-linear devices, they generate what is referred to as "1/f" noise or second-order distortion. This noise is called 1/f noise because its power spectra is generally inversely proportional to the frequency—in other words, the power of the noise signal is higher close to DC (direct current).

In the topology of the invention, this second-order distortion is removed using the high pass filter (HPF) 54. Because the second mixer 56 is a passive mixer, it does not introduce new second-order distortion into the signal. Thus, this topology provides the benefits of active mixing, without introducing second-order distortion into the output signal.

A number of embodiments of the invention will now be described.

Modulator/Demodulator Topology for a Single-Ended RF Input

Figure 3:
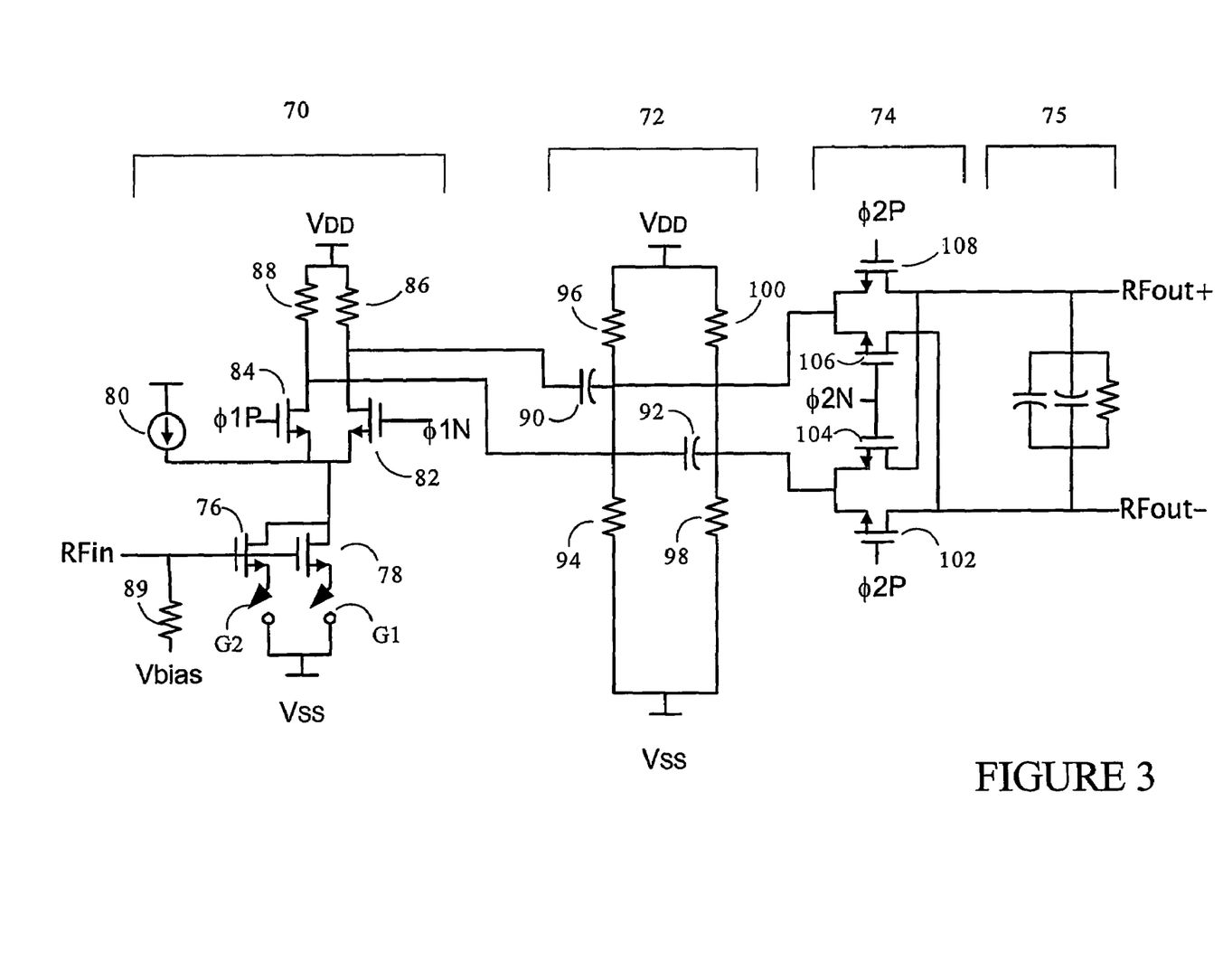
FIG. 3 presents a schematic diagram of a modulator/demodulator topology for a single-ended RF input, in a broad embodiment of the invention.

FIG. 3 presents an exemplary schematic diagram of an implementation of the invention having the following characteristics:

1. the active mixer 70 is a single-balanced active mixer which receives a single-ended RF input. As well, it has electronically adjustable gain and a differential output;
2. the high pass filter 72 is differential, and also incorporates a voltage divider for setting the common mode output, and rejecting common mode noise and second order distortion terms; and
3. the passive mixer 74 is a differential passive mixer.

An optional low pass filter 75 is also shown in this figure. If the circuit is being used to demodulate an input RF signal down to baseband, then this low pass filter 75 may be used to block frequencies beyond those in which the desired signal is expected to appear.

The input to this circuit is a simple, single-ended RF signal labelled RFin (single-ended means there is a single potential with respect to ground), and the output is a differential RF or baseband signal labelled RFout+ and RFout−. The frequency of the Rfin signal is modulated or demodulated, up or down, to RFout+ and RFout− in accordance with the parameters of the mixing signals.

Figure 5:
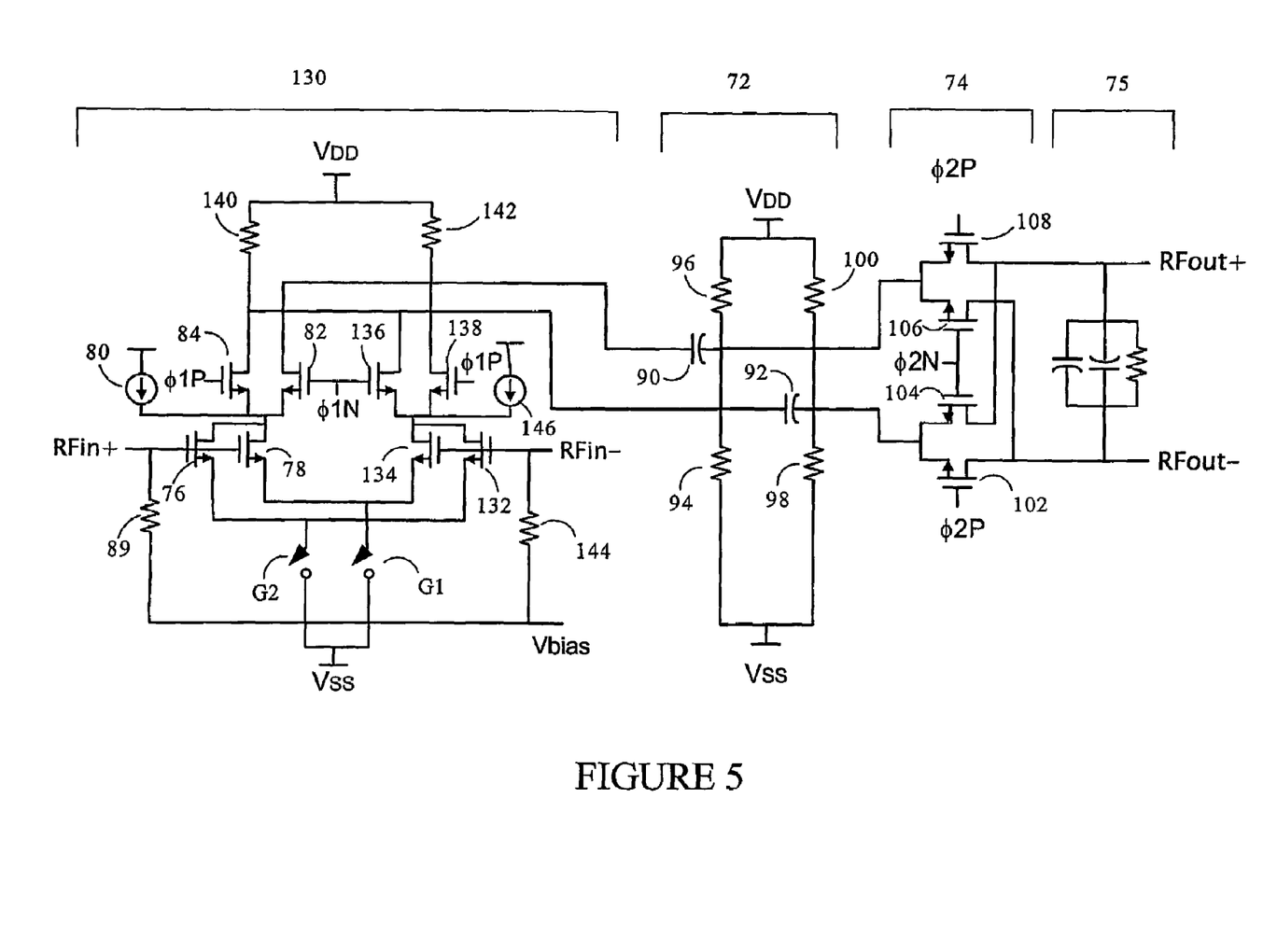
FIG. 5 presents a schematic diagram of a modulator/demodulator topology for a differential RF input, in an embodiment of the invention.
Figure 6:
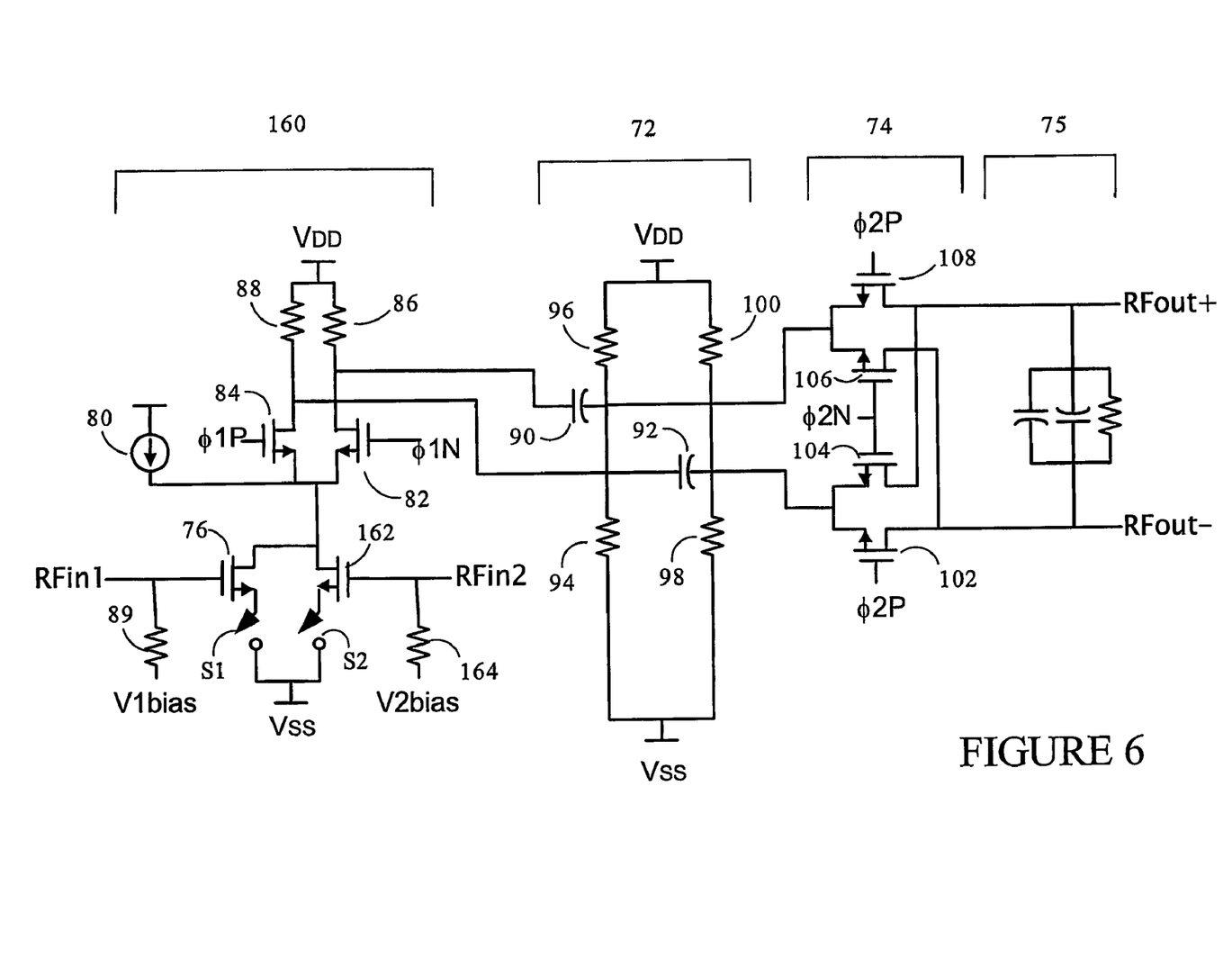
FIG. 6 presents a schematic diagram of a modulator/demodulator topology for a single-ended RF input in a multi-band/multistandard transceiver, in an embodiment of the invention.

In each of the embodiments of FIGS. 3, 5 and 6, four mixing signals are used, in two stages. The first stage mixes the input signal with a pair of aperiodic signals $\phi1P$ and $\phi1N$, where $\phi1P$ and $\phi1N$ are inverses of one another, that is: $\phi1P=-(\phi1N)$. Similarly, the second mixing stage mixes the received signal with aperiodic signals $\phi2P$ and $\phi2N$, where again, $\phi2P$ and $\phi2N$ are inverses of one another: $\phi2P=-(\phi2N)$. As well, these pairs of mixing signals exhibit the synergy described above, that is, the pair of mixing signals $\phi1P$ and $\phi2P$ can emulate a local oscillator.

As well, each of the circuits in FIGS. 3, 5 and 6 is powered by a positive voltage source ($V_{DD}$) and a negative voltage source ($V_{SS}$).

Because the active mixer 70 is a single-balanced mixer, it will generate less noise than a double-balanced mixer (see the description of a double-balanced mixer with respect to FIG. 5). This is simply because there are fewer noise contributors in the single-balanced design. However, the single-balanced mixer is less immune to external noise, particularly common mode noise.

Figure 4:
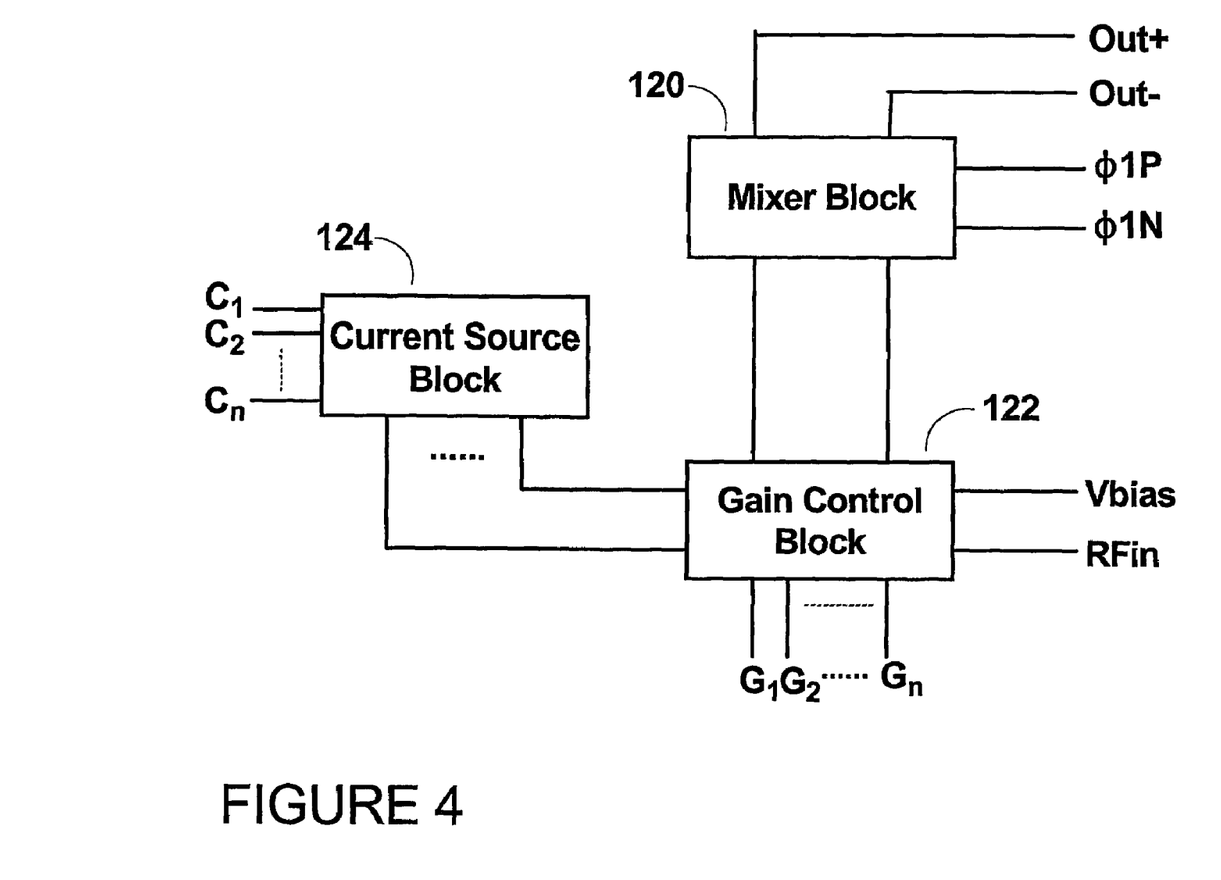
FIG. 4 presents a block diagram of an exemplary active mixer with adjustable performance parameters, which can be employed in an embodiment of the invention.

The structure of the active mixer 70 is also presented in the block diagram of FIG. 4 where the components are collected into three groups: a Mixer Block 120, a Gain Control Block 122, and a Current Source Block 124.

Briefly, the Gain Control Block 122 is a gain-providing stage that consists of a number of input transistors, shown in FIG. 3 as transistors 76 and 78. Each input transistor is fed with the same input signal RFin, and their outputs are fed to the Mixer Block 120 as amplified signals. The selection of the input transistor to be used at a particular time is accomplished using switches $G_1, G_2 \ldots G_n$.

The conditions of operation, and hence performance, of the Gain Control Block 122 are further alterable through the Current Source Block 124 which provides a variable amount of biasing current to the Gain Control Block 122. The amount of biasing current is controlled by the application of various conditions to current control inputs $C_1, C_2 \ldots C_n$.

While only two input transistors 76 and 78 are shown in FIG. 3, each having different biasing and other electrical performance characteristics, it will be apparent to one skilled in the art that this number might be varied to accommodate the design considerations of a particular application. The changes to the circuitry to adjust for this varied number would be clear to one skilled in the art.

Using multiple input transistors has the effect of increasing the number of possible combinations of conditions and performance available to be chosen without significantly increasing the size and complexity of the circuitry.

FIG. 4 also presents the relationship of the Gain Control Block 122 to the Current Source Block 124. The Current Source Block 124 provides a means to control the amount of current being fed to the Gain Control Block 122 so that this current is not drawn entirely from the Mixer Block 130.

The Current Source Block 124 comprises a number of controllable current sources. In FIG. 3, only one current source 80 is shown, but multiple sources and electronic switches could be employed. The control is limited to the ability to enable or disable a particular current source, which is accomplished using the current control inputs $C_1, C_2 \ldots C_n$.

If two current sources are used, it is possible to select both current sources so that their combined currents are passed to the Gain Control Block 122, thereby providing up to three different current levels. Similarly, having three current sources will allow up to seven different current levels to be selected.

The current source 80 is arranged to provide the current required by the RF amplifier transistors 76 and 78 thereby requiring the active mixer switches 82 and 84 to provide only a small proportion of the current required for the Gain Control Block 122. As will be appreciated by those skilled in the art, the reduced contribution of current to the Gain Control Block 122 via the active mixer switches 82 and 84, results in less noise being referred to the inputs of the RF amplifier transistors 76 and 78 and also less noise being generated by the resistive load of the active mixer circuit 70, resulting in improved overall noise performance. At the same time, the total current flowing through the RF amplifier transistors 76 and 78 can be maintained at a level sufficient to ensure their operation at the required gain and linearity.

The linearity of the active mixer 70 is also improved by this current injection between the input amplifier and the mixer switching transistors 86 and 88 because the current flowing through the input amplifier (Gain Control Block 122) can be substantially independent of that flowing through the mixer switches transistors 86 and 88. This independence means that the switches can be biased optimally without prejudicing the noise and gain performance of the input amplifier stage (Gain Control Block 122).

The balanced mixer block 120 is effected by two separate transistor and resistor pairings, which receive the amplified RF signals from the Gain Control Block 122. The amplified RF signal is passed to the sources of the switching transistors 82 and 84, and the drains of transistors 82 and 84 are connected independently to load resistors 86 and 88. By feeding the gates of the switching transistors 82 and 84 with complementary mixing signals $\phi1P$ and $\phi1N$, that is, $\phi1P=-(\phi1N)$, a differential output signal is received at Out+ and Out−. The value of the load resistors 86 and 88 is selected to provide the best bias conditions for the mixer transistors.

The RFin signal to the active mixer 70 may also by regulated using an input bias voltage and resistor 89.

Additional details regarding the design and implementation of the active mixer 70 are given in the co-pending patent application filed under Canadian Patent Application Serial No.2,375,438, titled: "Improvements to a High Linearity Gilbert I Q Dual Mixer".

Other active mixer designs may also be used, as known in the art, or variations on the above used. For example, the RF amplifier transistors 76, 78 in the Gain Control Block 122 may be degenerated by an impedance to improve its linearity. Reactive degeneration generally has better noise performance than resistive degeneration, and inductive degeneration is more current efficient than both resistive and capacitive degeneration. However, with capacitive degeneration, negative resistance may cause oscillation.

In the preferred embodiment though, field effect transistors (FETs) are used as shown in FIG. 3. FETs generally have sufficient linearity that degeneration is not necessary.

Outputs from the two switching transistors 86, 88 in the active mixer 70, are then passed through a pair of high pass filters 72, each consisting of a capacitor 90, 92 and two resistors 94, 96, 98 and 100. The use of the resistors 94, 96, 98 and 100 in the configuration of a voltage divider not only serves to drain the capacitors 90, 92 of the high pass filter, but also sets the common mode voltage for the next mixing stage (note that these resistors 94, 96, 98 and 100 could be active resistors).

Also, note that the cut-off frequency of the pair of high pass filters 72 can be very low (either low with respect to the carrier frequency or close to DC, depending on the application and expected signals). As a result it may be considered to function almost entirely in the manner of a voltage divider.

Also, the pair of high pass filters 72 might be effected in other manners, for example, in the form of an 'active resistor' network.

The outputs of the pair of high pass filters 72 are then passed to the inputs of the respective halves of a differential, passive mixer 74, whose other inputs are the aperiodic signals $\phi2P$ and $\phi2N$, which work in concert with the $\phi1P$ and $\phi1N$ mixing signals used in the active mixer 70. In FIG. 3, the passive mixer 74 comprises a known design having four transistors 102, 104, 106 and 108. Other architectures could also be used.

As noted above, this second mixing stage completes the emulation of the local oscillator mixing, frequency translating the input RFin signal to the desired output signal Out+/Out−. If this circuit is being used to demodulate a signal down to baseband, as it would in the case of a radio receiver, it may then be desirable to pass the outputs of the passive mixer 74 through a low pass filter 75 to remove any significant out-of-band signals. This low pass filter 75 may be a simple resistor/capacitor filter as known in the art and as shown in FIG. 3.

One of the further benefits of this design is the use of simple resistive elements to fix the active mixer biasing voltages. This assists in the selection of optimal performance parameters for the second passive mixer.

The linearity of an active mixer is dependent on the biasing voltage of transistors, thus, a simple voltage divider is used as the load of mixer. There are at least two sources of non-linearity in the active mixer 70: the non-linearity of the RF amplifier transistors and that of the switching transistors. The optimum biasing must be found through simulation or other techniques. The bias voltage applied to each of the drains of the active mixer switches is thereby selected and fixed to that necessary for optimum linearity during design.

Differential Application

Another embodiment of the invention is presented in FIG. 5 in which the input signal is available as a differential signal (i.e. having positive and negative potentials with respect to ground). This circuit is very much the same as that of FIG. 3, in fact, the high pass filter 72, passive mixer 74 and optional low pass filter 75 are identical. The active mixer 130 of this embodiment offers the same functionality as the single-balanced active mixer 72 of FIG. 3 (i.e. electronically adjustable gain and linearity controls), except that it is a double-balanced mixer which can receive a differential RF input.

As shown in FIG. 5, the circuit receives a differential voltage, RFin+, RFin− as the radio frequency (RF) input signal, an input bias voltage Vbias, and two pairs of differential aperiodic mixing signals φ1P and φ1N, and φ2P and φ2N. The output from this circuit is a modulated or demodulated differential output signal RFout+/RFout−.

The double-balanced mixer 130 simply comprises two single-balanced mixers with the same structure as the single-balanced mixer 70 described with respect to FIG. 3 above. Each of components in the single-balanced mixer 70 is mirrored in the second half of the double-balanced mixer as follows:
1. RF amplifier transistors 76 and 78 of the single-balanced mixer 70 are mirrored by transistors 132 and 134;
2. switching transistors 82 and 84 are mirrored by transistors 136 and 138;
3. current source 80 is mirrored by current source 146; and
4. the Vbias loading resistor 89 is mirrored by Vbias loading resistor 142 (these resistors 89 and 142 could also be active resistors).

The only departures from complete mirroring of two single-balanced mixers are as follows:
1. that the Gain Control inputs are operated together, thus it is only necessary to provide one set of control signals and switches $G_1, G_2 \ldots G_n$;
2. only a single pair of loading resistors 140 and 142 is necessary, though they would have different values than those of the single-balanced mixer 70 (as noted above, the value of the loading resistors is selected to provide the best bias conditions for the switching transistors 82, 84, 136 and 138); and
3. the outputs of the switching transistors 82, 84, 136 and 138 are tied together in pairs. The inputs RFin+ and RFin− are complements of one another, as are the aperiodic mixing signals φ1P and φ1N, thus:
RFin+⊕φ1P=RFin−⊕φ1N; and
RFin+⊕φ1N=RFin−⊕φ1P.

The operation of this circuit is thus the same as that described with respect to FIGS. 3 and 4 above, except that the double-balanced active mixer 130 modulates or demodulates the inputs RFin+ and RFin− separately before combining them.

The use of a differential input architecture results in a stronger output signal that is more immune to common mode noise than the single ended input architecture of FIGS. 3 and 4. If, for example, environment noise imposes a noise signal onto the input RFin of FIG. 3, then this noise signal will propagate through the circuit. However, if this environment noise is imposed equally on the RFin+ and RFin-inputs in the circuit of FIG. 5, then the net effect will be null.

Also as noted with respect to FIG. 3, the RF amplification portion of the active mixer can be degenerated by an impedance which could be a resistor, inductor, or capacitor. An RF amplifier with reactive (inductive or capacitive) degeneration has lower noise factor than that with resistive degeneration since the degeneration reactance (apart from its loss resistance) does not introduce an additional noise source. With inductive degeneration, the gain of the driver stage decreases with frequency. As well, for stability reasons, capacitive degeneration is not recommended since it may cause oscillation. However, if the circuit is implemented with FETs, degeneration may not be required as the inherent linearity of FETs is good enough for many applications.

Multi-Band/Multi-Standard Application

Another embodiment of the invention, suitable as part of a multi-band/multi-standard receiver, is presented in the electrical schematic of FIG. 6.

This topology is almost the same as those of FIGS. 3 and 5, where again, the high pass filter 72, passive mixer 74 and optional low pass filter 75 are identical. The active mixer 160 is almost identical to the single-balanced active mixer 72 of FIG. 3 (i.e. electronically adjustable gain and linearity controls), except that it offers the added functionality of receiving more than one RF input, which can be electronically selected.

This is effected simply by means of electronic switches ($S_1, S_2 \ldots S_n$) connected to the various RF inputs (RFin1, RFin2 ... RFinn), the switches being used to control which RF signal is to applied to the mixing transistor pair 82 and 84. While only two input are shown in FIG. 6, clearly more could easily be added.

Thus, when switch $S_1$ is selected, the input signal RFin1 is amplified by the amplifying transistor 76 (subject to the potential from V1 bias and resistor 89), and is passed to the Mixer Block (consisting of transistors 82 and 84, and resistors 86 and 88). When switch $S_2$ is selected, the input signal RFin2 passes through an identical circuit consisting of amplifying transistor 162, V2bias and resistor 164, to the Mixer Block (consisting of transistors 82 and 84, and resistors 86 and 88).

The balance of the components of the active mixer 160 operate in the same manner as components 80, 82, 84, 86 and 88 described above. The remaining systems in the circuit also operate in the same manner as described above, specifically: the high pass filter 72, passive mixer 74 and optional low pass filter 75.

This embodiment is quite significant however, as it presents an embodiment of the invention used for a multi-band/multi-standard receiver. The various RF inputs (RFin1, RFin2 ... RFinn) could, for example, correspond to different frequency bands being received by a cellular telephone, allowing it to pass seamlessly from a geographic area using one standard, to a geographic area using another standard. This multi-band/multi-standard receiver is fully integratable and does not require expensive off-chip components such as bandpass filters.

It is well known and understood in the art that mixer and ancillary components optimised for each desired standard can be implemented as separate subsystems and selected appropriately. The present invention not only permits optimisation to be carried out using substantially the same components in the signal path, but also allows the optimisation to be varied during operation, potentially dependent on real time measurement of performance and operating conditions such as interference and signal strength.

The benefits of the invention are most apparent when it is implemented within a single-chip design, eliminating the extra cost of interconnecting semiconductor integrated circuit devices, reducing the physical space they require and reducing the overall power consumption.

Virtual Local Oscillator Signals

As explained above, there is an emerging understanding that aperiodic mixing signals offer advantages over previously used mono-tonal oscillator signals. In the preferred embodiment, time-varying functions referred to herein as virtual local oscillator (VLO) signals are desired. A given pair of VLO signals $\phi_1$ and $\phi_2$ have the properties that:
1. their product emulates a local oscillator (LO) signal that has significant power at the frequency necessary to translate the input signal x(t) to the desired output frequency. For example, to translate the input signal x(t) to baseband, $\phi_1(t)*\phi_2(t)$ must have a frequency component at the carrier frequency of x(t); and
2. one of either $\phi_1$ and $\phi_2$, has minimal power around the frequency of the mixer pair output y(t), and the other has minimal power around the centre frequency, $f_{RF}$, of the input signal x(t). "Minimal power" means that the power should be low enough that it does not seriously degrade the performance of the RF chain in the context of the particular application.

For example, if the mixer pair is demodulating the input signal x(t) to baseband, it is preferable that one of either $\phi_1$ and $\phi_2$ has minimal power around DC.

As a result, the desired modulation or demodulation is affected, but there is no LO signal to leak into the signal path and appear at the output.

As noted above, mixing two signals generates an output with:
1. a signal equal in frequency to the sum of the frequencies of the input signals;
2. a signal equal in frequency to the difference between the frequencies of the input signals; and
3. the original input frequencies.

Thus, direct conversion receivers known in the art must mix the input signal x(t) with a LO signal at the carrier frequency of the input signal x(t). If the LO signal of a direct conversion receiver leaks into the signal path, it will also be demodulated to baseband along with the input signal x(t), causing interference. The invention does not use an LO signal, so leakage does not generate a signal at the baseband output y(t).

Any signal component at the frequency of the input signal x(t) or output y(t), in either of the mixing signals $\phi_1$ and $\phi_2$, is suppressed or eliminated by the other mixing signal. For example, if the mixing signal $\phi_2$ has some amount of power within the bandwidth of the up-converted RF (output) signal, and it leaks into the signal path, then if will be suppressed by the $\phi_1$ mixing signal which has minimal power within the bandwidth of the up-converted RF (output) signal. This complementary mixing suppresses interference from the mixing signals $\phi_1$ and $\phi_2$.

The two stage mixing presented in FIGS. 3 through 6 is exemplary, as any number of stages may be used, or the architecture changed to add further functionality. As well, a synthesizer for generating the time-varying mixer signals $\phi_1$ and $\phi_2$ may be comprised of a single device, or multiple devices.

As noted above, current receiver and transmitter technologies have several problems. Direct-conversion transceivers, for example, suffer from LO leakage and 1/f noise problems which limit their capabilities, while heterodyne transceivers require image-rejection techniques which are difficult to implement on-chip with high levels of performance.

The problems of image-rejection, LO leakage and 1/f noise in highly integrated transceivers can be overcome by using the complementary VLO signals. These signals are complementary in that one of the $\phi_1$ and $\phi_2$ signals has minimal power around the frequency of the output signal y(t) (which is around DC if conversion is to baseband), and the other has minimal power around the centre frequency, $f_{RF}$, of the input signal x(t).

These signals $\phi_1$ and $\phi_2$ can, in general, be:
1. random or pseudo-random, periodic functions of time;
2. analogue or digital waveforms;
3. constructed using conventional or non-conventional bipolar waves;
4. averaging to zero;
5. amplitude modulated; and
6. generated in a number of manners including:
   a. being stored in memory and clocked out;
   b. being generated using digital blocks;
   c. being generated using noise shaping elements (e.g. delta-sigma elements); or
   d. being constructed using PN sequences with additional bits inserted so they comply to the above conditions.

It would be clear to one skilled in the art that virtual LO signals may be generated which provide the benefits of the invention to greater or lesser degrees. While it is possible in certain circumstances to have almost no LO leakage, it may be acceptable in other circumstances to incorporate virtual LO signals which still allow a degree of LO leakage.

An exemplary set of acceptable waveforms is presented in FIG. 7, plotted in amplitude versus time. Mixing signals are typically presented herein in terms of binary 1s and 0s, however, bipolar waveforms, ±1, may also be used. Bipolar waveforms are typically used in spread spectrum applications because they use commutating mixers which periodically invert their inputs in step with a local control signal (this inverting process is distinct from mixing a signal with a local oscillator directly).

In FIG. 7, four cycles of the VLO signal are plotted in amplitude versus time, labelled $\phi_1*\phi_2$. It is important to note that at no point in the operation of the circuit is an actual "$\phi_1*\phi_2$" signal ever generated; the mixers M1, M2 receive separate $\phi_1$ and $\phi_2$ signals, and mix them with the input signal x(t) using different physical components. Hence, there is no LO signal which may leak into the circuit. The states of these $\phi_1$ and $\phi_2$ signals with respect to the hypothetical $\phi_1*\phi_2$ output are as follows:

| $\phi_1 * \phi_2$ | $\phi_1$ | $\phi_2$ |
|---|---|---|
| Cycle 1-LO | LO | LO |
| Cycle 1-HI | HI | LO |
| Cycle 2-LO | LO | LO |

-continued

| $\phi_1 * \phi_2$ | $\phi_1$ | $\phi_2$ |
|---|---|---|
| Cycle 2-HI | HI | LO |
| Cycle 3-LO | HI | HI |
| Cycle 3-HI | LO | HI |
| Cycle 4-LO | HI | HI |
| Cycle 4-HI | LO | HI |

Clearly, the two mixing signals $\phi_1$ and $\phi_2$ in FIG. 7 satisfy the above criteria. Any frequency component that one mixing signal might have around DC or around the centre frequency, $f_{RF}$, of the input signal x(t), is suppressed by the other. As well, the product of the two mixing signals is that of the desired LO frequency, so the input signal x(t) will be demodulated or modulated as desired.

While these signals may be described as "aperiodic", groups of cycles may be repeated successively. For example, the pattern of the $\phi_1$ and $\phi_2$ input signals presented in FIG. 7 which generate the $\phi_1*\phi_2$ signal, could be allowed to repeat with every four cycles, as shown. Longer cycles could certainly be used.

It would be clear to one skilled in the art that many additional pairings of signals may also be generated. The more thoroughly the criteria for selection of the $\phi_1$ and $\phi_2$ signals are complied with, the more effective the invention will be in overcoming the problems in the art.

Virtual local oscillator signals may also be generated in different forms, such as using three or more complementary signals rather than the two mixing signals shown above. These and other variations are described in the following co-pending patent applications:

1. PCT International Application Serial No. PCT/CA00/00995 Filed Sep. 1, 2000, titled: "Improved Method And Apparatus For Up-Conversion Of Radio Frequency (RF) Signals";
2. PCT International Application Serial No. PCT/CA00/00994 Filed Sep. 1, 2000, titled: "Improved Method And Apparatus For Down-Conversion Of Radio Frequency (RF) Signals"; and
3. PCT International Application Serial No. PCT/CA00100996 Filed Sep. 1, 2000, titled: "Improved Method And Apparatus For Up-And-Down-Conversion Of Radio Frequency (RF) Signals".

In-Phase and Quadrature Signals

Figure 8:
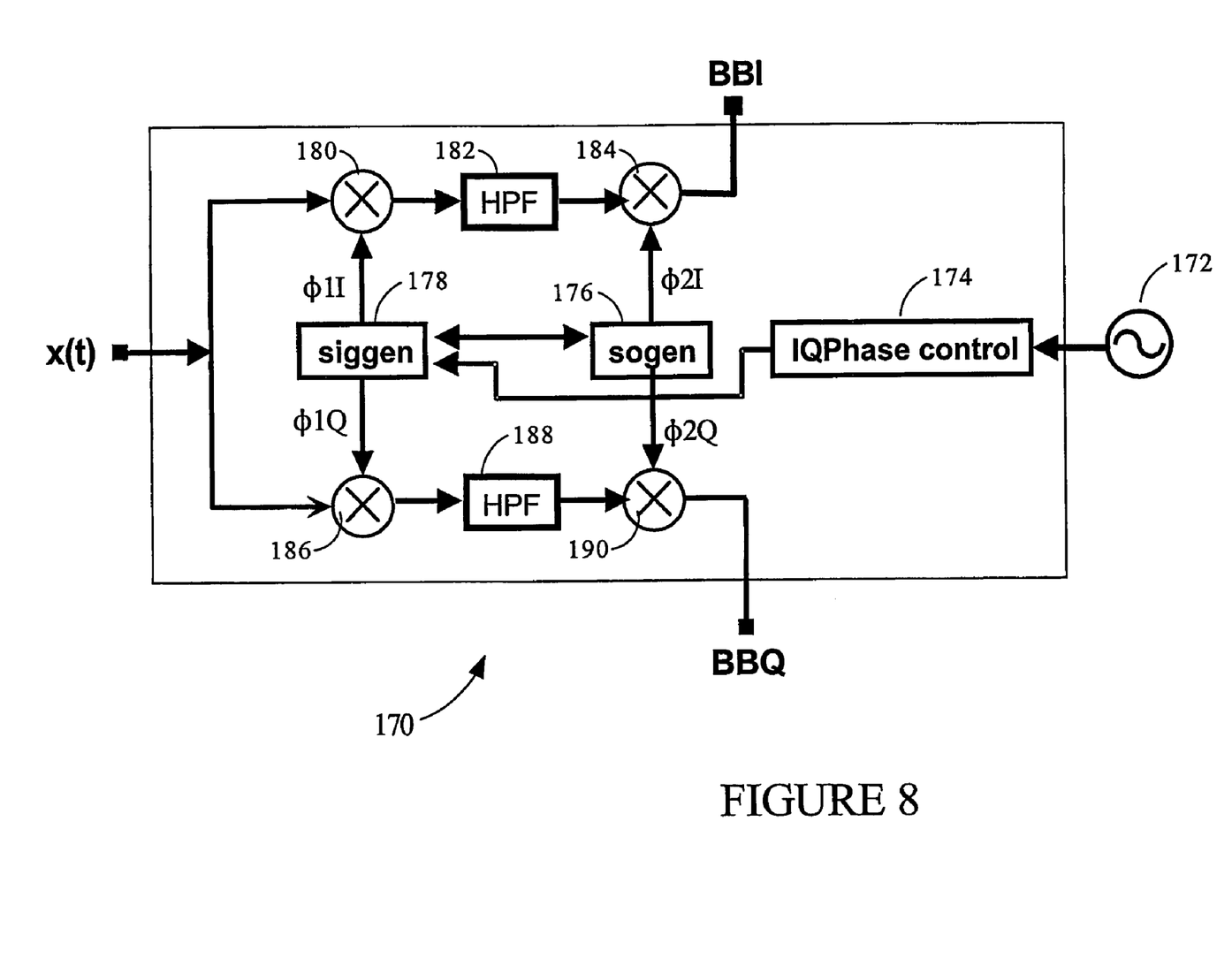
FIG. 8 presents a mixer and synthesizer arrangement for modulation or demodulation of in-phase and quadrature components of an input signal in an embodiment of the invention.

In many modulation schemes, it is necessary to modulate or demodulate both in-phase (I) and quadrature (Q) components of the input signal, which requires a modulator or demodulator 170 as presented in the block diagram of FIG. 8.

In this case, four modulation functions would have to be generated: $\phi 1I$ which is 90 degrees out of phase with $\phi 1Q$; and $\phi 2I$ which is 90 degrees out of phase with $\phi 2Q$. The pairing of signals $\phi 1I$ and $\phi 2I$ must meet the function selection criteria listed above, as must the signal pairing of $\phi 1Q$ and $\phi 2Q$.

Design of synthesizer components 172, 174, 176 and 178 to generate such signals would be clear to one skilled in the art from the description herein. Briefly, local oscillator 172 would be designed to operate at a frequency necessary to generate the aperiodic mixing signals $\phi 1I$, $\phi 2I$, $\phi 1Q$ and $\phi 2Q$, but would avoid the carrier frequency of the input signal x(t). The IQPhase control block 174 simply generates separate I and Q local oscillator signals, 90 degrees out of phase with one another. The sogen 176 and siggen 178 blocks then generate the aperiodic mixing signals in accordance with the restrictions described herewith. As noted above with respect to FIG. 7, additional details on the generation of such signals are available in the co-pending patent applications filed under PCT International Application Serial Nos. PCT/CA00/00994, PCT/CA00/00995 and PCT/CA00/00996.

The input signal x(t) is split between two signal streams, one comprising active mixer 180, high pass filter 182 and passive mixer 184, while the other stream comprises active mixer 186, high pass filter 188 and passive mixer 190. These active mixer, high pass filter and passive mixer components can be embodied as described above with respect to FIGS. 3 through 6. These two streams are identical expect that they are fed with different mixing signals, one being fed with the pairing of signals $\phi 1I$ and $\phi 2I$, and the other with the signal pairing of $\phi 1Q$ and $\phi 2Q$.

Thus, mixer 180 receives the input signal x(t) and mixes it with $\phi 1I$, after which mixer 182 mixes signal x(t) $\phi 1I$ with $\phi 2I$ to yield the in-phase component of the input signal, that is, x(t) $\phi 1I$ $\phi 2I$. A corresponding process occurs on the quadrature side of the circuit where mixer 186 receives the input signal x(t) and mixes it with $\phi 1Q$; following which mixer 190 mixes signal x(t) $\phi 1Q$ with $\phi 2Q$ to yield the quadrature phase component of the input signal, that is, x(t) $\phi 1Q$ $\phi 2Q$. If this circuit is being used to demodulate the input signal down to baseband then baseband in-phase (BBI) and baseband quadrature (BBQ) signals are output.

ADVANTAGES OF THE INVENTION

The application of the invention using irregular, time-varying mixer signals provides fundamental advantages over known transmitters and receivers. For example:
1. minimal 1/f noise;
2. minimal imaging problems;
3. minimal leakage of a local oscillator (LO) signal into the RF output band;
4. removes the necessity of having a second LO as required by super-heterodyne circuits, and various (often external) filters; and
5. has a higher level of integration as the components it does require are easily placed on an integrated circuit. For example, no large capacitors or sophisticated filters are required.

A high level of integration results in decreased IC (integrated circuit) pin counts, decreased signal power loss, decreased IC power requirements, improved SNR (signal to noise ratio), improved NF (noise factor), and decreased manufacturing costs and complexity.

The invention provides the basis for fully integrated, multi-standard/multi-frequency communications transmitters and receivers. Increasing levels of integration have been the driving impetus towards lower cost, higher volume, higher reliability and lower power consumer electronics since the inception of the integrated circuit. This invention will enable communications devices to follow the same integration route that other consumer electronic products have benefited from.

Specifically, advantages from the perspective of the manufacturer when incorporating the invention into a product include:
1. significant cost savings due to the decreased parts count of an integral device. Decreasing the parts count reduces the cost of inventory control, reduces the costs associated with warehousing components, and reduces the amount of manpower to deal with higher part counts;

2. significant cost savings due to the decreased manufacturing complexity. Reducing the complexity reduces time to market, cost of equipment to manufacture the product, cost of testing and correcting defects, and reduces time delays due to errors and problems on the assembly line;
3. reduces design costs due to the simplified architecture. The simplified architecture will shorten the first-pass design time and total design cycle time as a simplified design will reduce the number of design iterations required;
4. significant space savings and increased manufacturability due to the high integrability and resulting reduction in product form factor (physical size). This implies huge savings throughout the manufacturing process as smaller device footprints enable manufacturing of products with less material such as printed circuit substrate, smaller product casing, and smaller final product packaging;
5. simplification and integrability of the invention will yield products with higher reliability, greater yield, less complexity, higher life span and greater robustness; and
6. due to the aforementioned cost savings, the invention will enable the creation of products that would otherwise be economically unfeasible.

Hence, the invention provides the manufacturer with a significant competitive advantage.

From the perspective of the consumer, the marketable advantages of the invention include:
1. lower cost products, due to the lower cost of manufacturing;
2. higher reliability as higher integration levels and lower parts counts imply products will be less prone to damage from shock, vibration and mechanical stress;
3. higher integration levels and lower parts counts imply longer product life span;
4. lower power requirements and therefore lower operating costs;
5. higher integration levels and lower parts counts imply lighter weight and physically smaller products; and
6. the creation of economical new products.

CONCLUSIONS

The invention is applicable to those semiconductor technologies used in most consumer-intended communications devices, such as silicon. Those skilled in the art will also understand that the integrated circuit technology might be other than silicon. It is therefore the intent of the inventors to include integrated circuit technologies other than silicon, and higher frequency applications within the scope of this invention.

It will be apparent to those skilled in the art that the invention can be extended to cope with more than two or three standards, and to allow for more biasing conditions than those in the above description.

Although the invention has been described in a particular implementation of a receiver, those skilled in the art will recognise that the invention is applicable in any highly integrated semiconductor technology required to deal with multiple standards, and reception conditions, particularly, but not limited to, those frequencies exceeding 800 MHz, in situations where overall system power efficiency, and overall size of the final system are significant factors.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

The embodiments of the invention may be implemented on various families of integrated circuit technologies using digital signal processors (DSPs), microcontrollers, microprocessors, field programmable gate arrays (FPGAs), or discrete components. Such implementations would be clear to one skilled in the art.

The various preferred implementations in this section are each described in terms of field effect transistors. The implementations are equally advantageous when other technologies are used, including, but not limited to CMOS or Bipolar Junction Transistors. Similarly, suitable fabrication technologies other than Silicon (Si) may be used, including, but not limited to Silicon/Germanium (SiGe), Germanium (Ge), Gallium Arsenide (GaAs), and Silicon on Sapphire (SOS). It is the inventors' intention to protect all such implementations.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, it is clear that changes and modifications may be made to such embodiments without departing from the true scope and spirit of the invention.

What is claimed is:

1. A modulation or demodulation circuit comprising:
   a synthesizer for generating a first aperiodic mixing signal $\phi_1$ and second aperiodic mixing signals $\phi_2$, where $\phi_1 * \phi_2$ has significant power at the frequency of a local oscillator signal being emulated, and neither said first aperiodic mixing signal $\phi_1$ nor said second aperiodic mixing signal $\phi_2$ has significant power at the frequency of said local oscillator signal being emulated;
   an active mixer for receiving an input signal and mixing said input signal with a first aperiodic mixing signal $\phi_1$, said active mixer having adjustable performance;
   a high pass filter electrically connected to the output of said active mixer, generating a filtered, mixed signal; and a passive mixer connected to the output of said high pass filter, for receiving said filtered, mixed signal and said second aperiodic mixing signal $\phi_2$, said second aperiodic mixing signal $\phi_2$ being different from said first aperiodic mixing signal, and mixing said filtered, mixed signal with said second aperiodic mixing signal $\phi_2$, to generate a modulated or demodulated signal.

2. The circuit of claim 1, wherein said first aperiodic mixing signal $\phi_1$ and said second aperiodic mixing signal $\phi_2$ emulate a local oscillator signal.

3. The circuit of claim 1, further comprising a signal generator for generating said first aperiodic mixing signal $\phi_1$ and said second aperiodic mixing signals $\phi_2$.

4. The circuit of claim 1, wherein said active mixer has adjustable gain.

5. The circuit of claim 1, wherein said active mixer has adjustable linearity.

6. The circuit of claim 1, wherein said active mixer comprises a current source whose parameters can be adjusted to control gain and linearity of said active mixer.

7. The circuit of claim 1, wherein said active mixer comprises multiple driver components, each for receiving a different input signal in a multi-standard radio.

8. The circuit of claim 1, wherein each of said active mixer, said filter and said passive mixer is a differential device.

9. The circuit of claim 1, wherein the corner frequency of said high pass filter is low relative to the input and mixing signals, whereby it only suppresses DC signal components.

10. The circuit of claim 1, wherein the corner frequency of said high pass filter is low relative to the input and mixing signals, whereby it only suppresses second order distortion.

11. The circuit of claim 1, wherein said high pass filter comprises a resistor dividing network.

12. The circuit of claim 11 wherein said resistor dividing network comprises an active resistor dividing network.

13. The circuit of claim 11 wherein said resistor dividing network is calibrated to adjust the common mode voltage output.

14. The circuit of claim 4, wherein said active mixer includes switches allowing its gain and noise figure to be adjusted, and said second mixer is purely passive thereby reducing its 1/f noise.

15. The circuit of claim 5, wherein said active mixer includes switches allowing its noise figure and linearity to be adjusted.

16. The circuit of claim 1, wherein said high pass filter comprises a capacitor in-line with the signal path.

17. The circuit of claim 1 wherein said active mixer comprises:
an RF amplifier for amplifying said input signal;
a balanced mixer for mixing said amplified input signal with said first aperiodic mixing signal $\phi_1$; and
a current injection circuit arranged to provide extra current to said balanced mixer, thereby controlling the current supplied to said RF amplifier and reducing the current supplied through said balanced mixer.

18. The circuit of claim 17 wherein said active mixer comprises said RF amplifier and a pair of active balanced mixers in a totem pole arrangement.

19. The circuit of claim 17 wherein said RF amplifier comprises two transistors arranged to amplify a balanced RF input signal.

20. The circuit of claim 17 wherein said current injection circuit comprises a constant current source.

21. The circuit of claim 20 wherein said current injection circuit comprises multiple constant current sources thereby permitting variation in the gain of the RF amplifier and also permitting adjustment of the gain and linearity of the RF amplifier circuit during and after manufacture.

22. A method of up or down conversion comprising the steps of:
generating a first aperiodic mixing signal $\phi_1$ and a second aperiodic mixing signals $\phi_2$, where $\phi_1 * \phi_2$ has significant power at the frequency of a local oscillator signal being emulated, and neither said first aperiodic mixing signal $\phi_1$ nor said second aperiodic mixing signal $\phi_2$ has significant power at the frequency of said local oscillator signal being emulated;
active mixing an input signal with a first aperiodic mixing signal $\phi_1$, to generate a first mixed signal;
high pass filtering said first mixed signal, to generate a filter signal; and
passive mixing said filter signal with a second aperiodic mixing signal, said second aperiodic mixing signal $\phi_2$ being different from said first aperiodic mixing signal $\phi_1$, to generate a up or down converted signal.

* * * * *